(12) United States Patent
Cai et al.

(10) Patent No.: US 6,489,203 B2
(45) Date of Patent: Dec. 3, 2002

(54) STACKED LDD HIGH FREQUENCY LDMOSFET

(75) Inventors: Jun Cai, Singapore (SG); Pang Dow Foo, Singapore (SG); Narayanan Balasubramanian, Singapore (SG)

(73) Assignee: Institute of Microelectronics, Singapore (SG)

( * ) Notice: Subject to any disclaimer, the term of this patent is extended or adjusted under 35 U.S.C. 154(b) by 0 days.

(21) Appl. No.: 09/849,675

(22) Filed: May 7, 2001

(65) Prior Publication Data

US 2002/0164844 A1 Nov. 7, 2002

(51) Int. Cl.[7] .............................................. H01L 21/336
(52) U.S. Cl. ........................ 438/268; 438/286; 438/307; 438/546
(58) Field of Search ................................. 438/138, 268, 438/269, 286, 306, 307, 527, 529, 545, 546

(56) References Cited

U.S. PATENT DOCUMENTS

| | | | |
|---|---|---|---|
| 5,585,294 A | 12/1996 | Smayling et al. | 437/44 |
| 5,869,875 A | 2/1999 | Hebert | 257/382 |
| 6,087,232 A | 7/2000 | Kim et al. | 438/289 |
| 6,093,609 A * | 7/2000 | Chuang | 438/286 |
| 6,118,152 A | 9/2000 | Yamaguchi et al. | 257/347 |
| 6,144,070 A | 11/2000 | Devore et al. | 257/343 |
| 6,312,996 B1 * | 11/2001 | Sogo | 438/306 |

OTHER PUBLICATIONS

Der–Gaolin et al., in "A Novel LDMOS Structure with a Step Gate Oxide," IEDM 1995, pp. 38.2.1–38.2.2, (pp. 963–966).

* cited by examiner

Primary Examiner—Chandra Chaudhari
(74) Attorney, Agent, or Firm—George O. Saile; Stephen B. Ackerman

(57) ABSTRACT

A novel silicon RF LDMOSFET structure based on the use of a stacked LDD, is disclosed. The LDD has been modified from a single layer of N type material to a stack of three layers. These are upper and lower N type layers with a P type layer between them. The upper N type layer is heavily doped to reduce the on-resistance of the device, while the lower N type layer is lightly doped to reduce the output capacitance, thereby improving the high frequency performance. The middle P layer is heavily doped which allows it to bring about pinch-off of the two N layers, thereby raising the device's breakdown voltage. A process for manufacturing the device, as well as experimental data concerning its performance are also given.

8 Claims, 4 Drawing Sheets

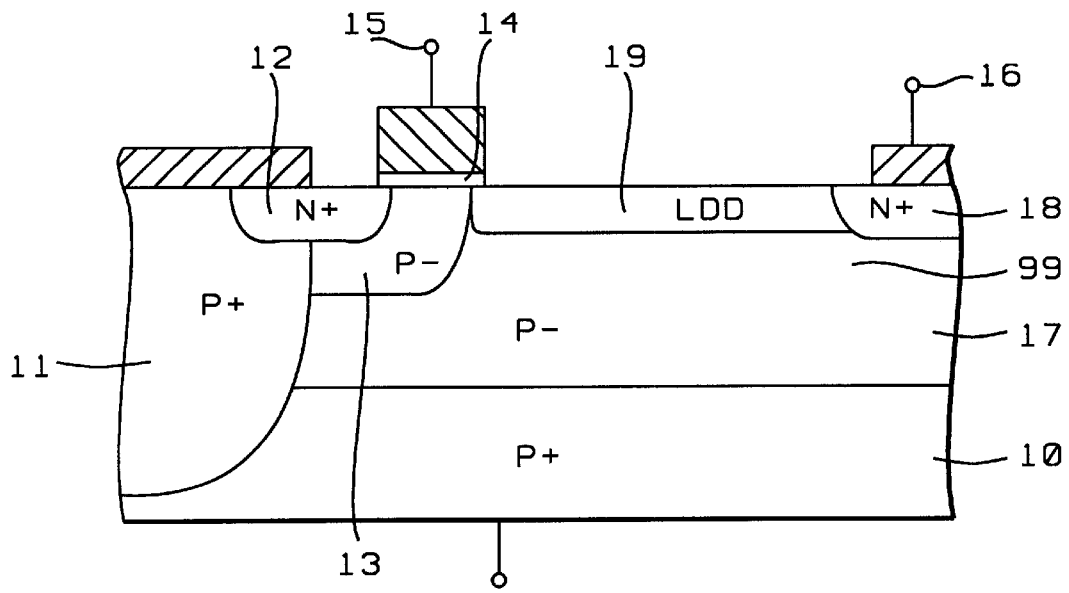
*FIG. 1 - Prior Art*
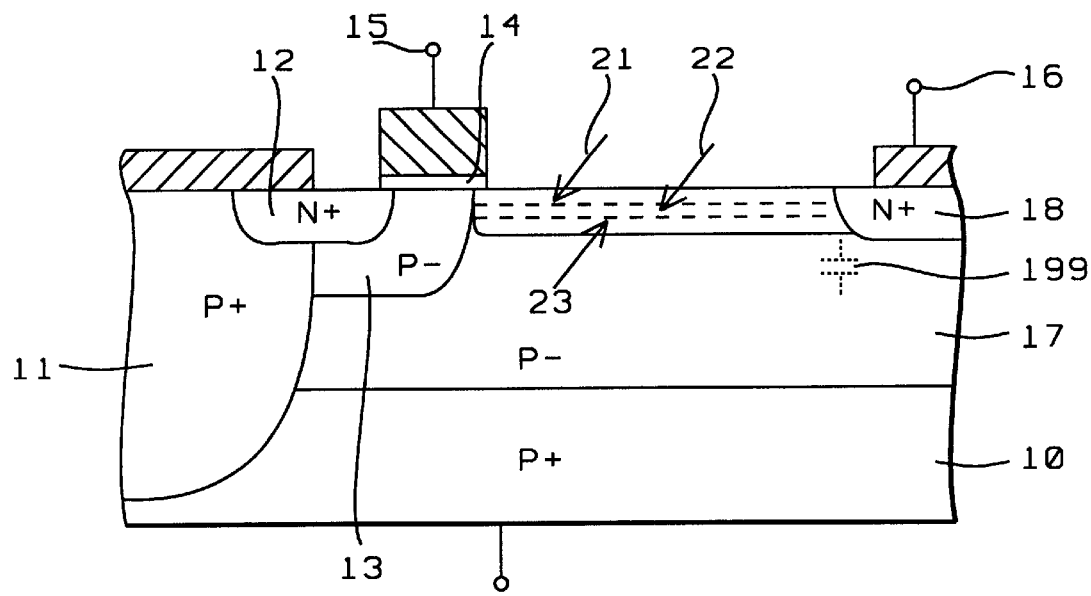
*FIG. 2*

STACKED LDD HIGH FREQUENCY LDMOSFET

FIELD OF THE INVENTION

The invention relates to the general field of high frequency power devices with particular reference to reducing on-resistance while increasing breakdown voltage.

BACKGROUND OF THE INVENTION

High frequency power devices, have become an indispensable part of modern personal communication systems. Among the various power devices, the LDOMOSFET (Lateral Double-diffused metal oxide field effect transistor) is becoming more popular than its bipolar and GaAs counterparts. The desirable characteristics of RF LDMOSFET are a high frequency performance, a low on-state voltage drop, and a high blocking voltage.

The device structure of a conventional RF LDMOS is shown in FIG. 1. Heavily doped p+ sinker 11 is used to connect the source 12 to the substrate 10. This enables the source to be led out from the bottom, saving the source bond wire and minimizing the common lead inductance thus offering a better RF performance. An N-LDD (Lightly Doped Drain) region 19 with a shallow junction is used as the drift region. The on-resistance of the conventional high voltage power LDMOS is mainly dominated by the resistance of the voltage sustaining LDD region. The LDMOS blocking capability is mainly determined by the LDD length and doping concentration.

Also shown in FIG. 1 are polysilicon gate 15, gate oxide 14, epitaxially formed P-body 17, diffusion formed P-body 13, drain region 18, and drain contact 16. Additionally, the output capacitance of the device is schematically shown as capacitor 99.

Because the doping concentration in the drift region is severely restricted by the blocking voltage, a trade-off exists between high breakdown voltage and low on-state resistance. This trade-off also limits the achievable application frequency of a high voltage RF LDMOSFET. Several approaches to improving the on-state resistance/breakdown voltage tradeoff have been proposed such as, for example, Der-Gao Lin et al. in "A novel LDMOS structure with a step gate oxide" IEDM 1995, pp. 38.2.1–38.2.2. With this approach the length of the drift region can be reduced so that the resistance is lowered without affecting the breakdown voltage.

For high voltage RF LDMOS, in which the drift region constitutes the major source of on-resistance, the main emphasis in improving the transistor performance must be directed towards reducing the LDD resistance. In the present invention a novel RF LDMOS with a stacked LDD structure using existing multiple implant technology is disclosed. Without the need of extra masks, the device was implemented using standard RF LDMOS processing technology.

A routine search of the prior art was performed with the following references of interest being found:

Der-Goa Lin, et al. "A novel LDMOS Structure with a step gate oxide", IEDM, 1995—pp. 963 to 966. U.S. Pat. No. 5,585,294(Smayuling et al.) shows a DD LDMOS with multiple LDD's. U.S. Pat. No. 5,869,875(Herbert) shows a LDMOS with a trench source contact and sinker. U.S. Pat. No. 6,087,232(Kim et al.), U.S. Pat. No. 6,144,070(Devore et al.) and U.S. Pat. No. 6,118,152(Yamaguchi et al.) show related LDMOS devices and methods.

SUMMARY OF THE INVENTION

It has been an object of the present invention to provide a LDMOSFET with both higher breakdown voltage and lower on-state resistance than comparable devices of the prior art.

Another object of the invention has been to provide a LDMOSFET with improved high frequency characteristics relative to comparable devices of the prior art.

Still another object has been to provide a process for the manufacture of said improved LDMOSFET.

A further object has been that said manufacturing process be made up of processing steps already in regular use.

These objects have been achieved by changing the composition of the conventional LDD structure that lies between the gate and the drain from a single layer of N type material to a stack of three layers. These are upper and lower N type layers with a P type layer between them. The upper N type layer is heavily doped to reduce the on-resistance of the device, while the lower N type layer is lightly doped to reduce the output capacitance, thereby improving the high frequency performance. The middle P layer is heavily doped which allows it to bring about pinch-off of the two N layers, thereby raising the device's breakdown voltage.

BRIEF DESCRIPTION OF THE DRAWINGS

FIG. 1 is a cross-sectional view of an RF LDMOS structure of the prior art.

FIG. 2 is a cross-sectional view of the stacked LDD RF LDMOS structure.

DESCRIPTION OF THE PREFERRED EMBODIMENTS

The LDMOS structure of the present invention is shown in FIG. 2. The key difference between the invention and the prior art structure shown in FIG. 1 lies in the LDD portion of the device. As can be seen, the single N type layer 19 of the prior art structure has been replaced by a stacked LDD comprising three layers—N type layer 21, P type layer 22, and N type layer 23.

This modification of the prior art structure minimizes the drift region resistance while at the same time maintaining a high blocking voltage. Layer 21 (LDD1) has a high doping concentration and junction depth that is sufficient to reduce the on-resistance of the device, while layer 23 (LDD3) has a low doping concentration and a deeper junction depth that serves to reduce the output capacitance. Layer 22 (LDD2) has high P doping, which introduces additional negative charges that can cause pinch-off of the LDD1 and LDD3 regions. The totally depleted drift region supports the device breakdown voltage.

Figure 3A:
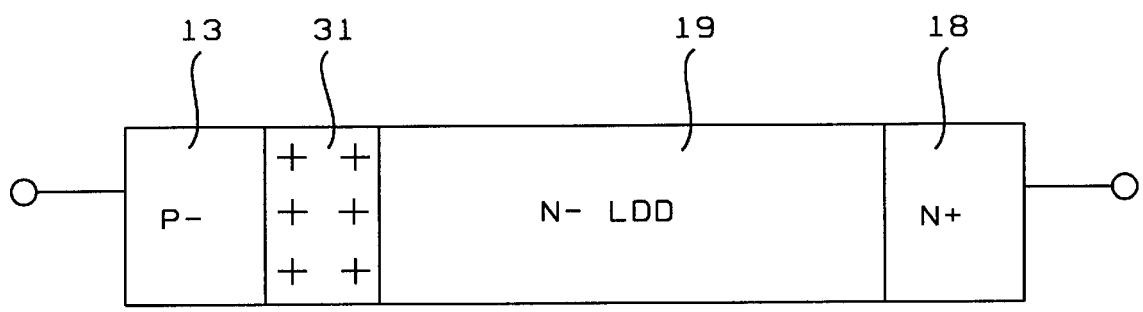
FIG. 3a is a schematic representation a conventional LDD structure with arrows indicating spreading directions of depletion edges and dotted lines showing the depletion edge.
Figure 3B:
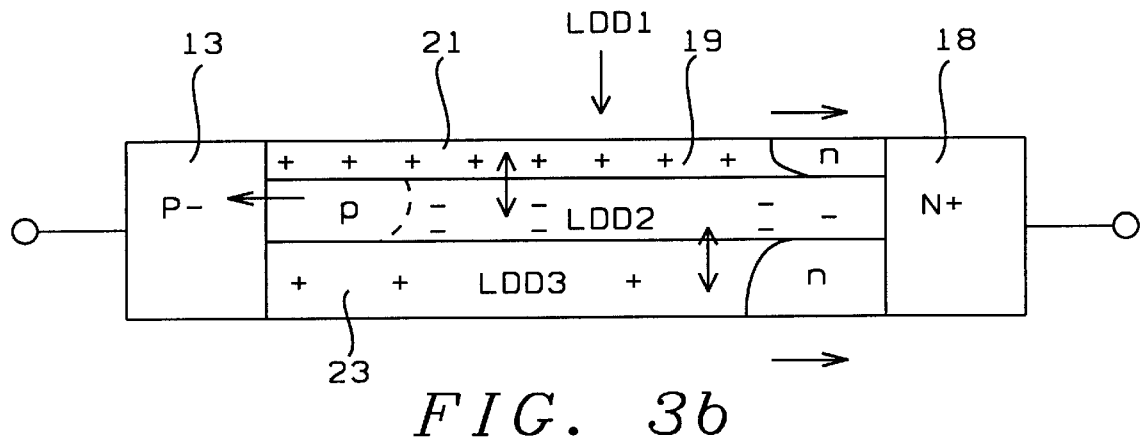
FIG. 3b is similar to FIG. 3a except it is for a stacked LDD RF LDMOS device.

Shown in FIGS. 3a and 3b is a schematic comparison between a conventional LDD structure, such as the device of FIG. 1, and the stacked LDD structure of the present invention. FIG. 3a shows a single layer LDD of the prior art having a single depletion layer 31 that extends into it from P− body 13. FIG. 3b shows how LDD2 helps to deplete LDD1 and LDD3 while it itself is also being depleted at the same time. This is possible because a reverse-biased voltage across the LDD2/LDD1 and LDD2/LDD3 junctions exists. This in turn is because LDD2 is connected to P− body 13, which is grounded, while LDD1 and LDD3 are connected to N+ drain 18 which has a high applied positive bias.

Thus, in addition to a depletion layer due to the P− body (prior art case), LDD1 and LDD3 are depleted in both the lateral and vertical directions due to the existence of LDD2. Assuming the doping levels and the junction depths are properly selected, it becomes possible to deplete all of the stacked LDD regions. Thus the increase in the LDD1 doping level (which can be much higher than in a prior art device) will reduce the on-state resistance of the device. Therefore, the device current handling capability is improved. As a result, the Ron of the stacked structure will be much lower than that of a conventional structure having the same Bvds (breakdown voltage source-to-drain).

The process of the present invention uses conventional LDMOS process steps in a novel manner in order to form the structure of the present invention. Referring once again to FIG. 2, the process begins with the provision of a starting wafer 10 of P+ silicon. and depositing thereon epitaxial layer, of P− silicon, 17. Then P+ sinker region 11 that extends downwards from the top surface, through the P− epitaxial layer 17 into the P+ substrate 10 is formed by means of ion implantation through a mask. This is followed by a drive-in diffusion.

Next, a layer of gate oxide 14 is grown on the top surface and a layer of phosphorus doped polysilicon 15 is deposited over it to a sheet resistance of about 10 ohms per square. The polysilicon is patterned and etched to form gate pedestal 15. By P− body implant through a P− body mask, followed by a P− body diffusion process and N+ source implant through a N+ source mask, followed by an N+ diffusion process (LDMOS double diffusion), N+ source region 12 is formed on one side of the gate pedestal (on its left in this example) as well as P− body 13. The latter extends outwards from source region 12 and emerges at the top surface underneath gate oxide 14. By ion implantation through a mask, drain region 18 is then formed on the opposite side of the gate, there being a separation region between gate 15 and drain region 18 for the LDD with a blank LDD implant. This separation region has a length of between about 2 and 40 microns.

Now follows a key feature of the invention. By ion implantation (60 keV arsenic at $7 \times 10^{12}$ per sq. cm), N type layer 21 (LDD1) is formed in the separation region. This is followed by the formation of P type layer 22 (LDD2) using 45 keV boron at $7 \times 10^{12}$ per sq. cm located immediately below LDD1. N type layer 23 (LDD3) was placed immediately below LDD2 by using 200 keV phosphorus at $2.5 \times 10^{12}$ per sq. cm. Use of the above ion energies and fluences resulted in the LDD1 layer having a resistivity between about 0.002 and 0.02 ohm cm and a thickness between about 300 and 2,000 Angstroms. For LDD2, the resistivity was between about 0.007 and 0.05 ohm cm for a thickness of between about 1,000 and 3,000 Angstroms while for LDD3 the resistivity was between about 0.03 and 0.2 ohm cm and its thickness was between about 1,000 and 6,000 Angstroms.

Provided the thicknesses and resistivities of the three layers fall within the ranges cited above, devices made this way (i.e. the stacked LDMOSFET of the present invention) have breakdown voltages greater than about 70 volts, an on-resistance less than about 0.05 ohms per micron in the linear region, and a peak frequency response greater than 7 GHz.

Figure 4:
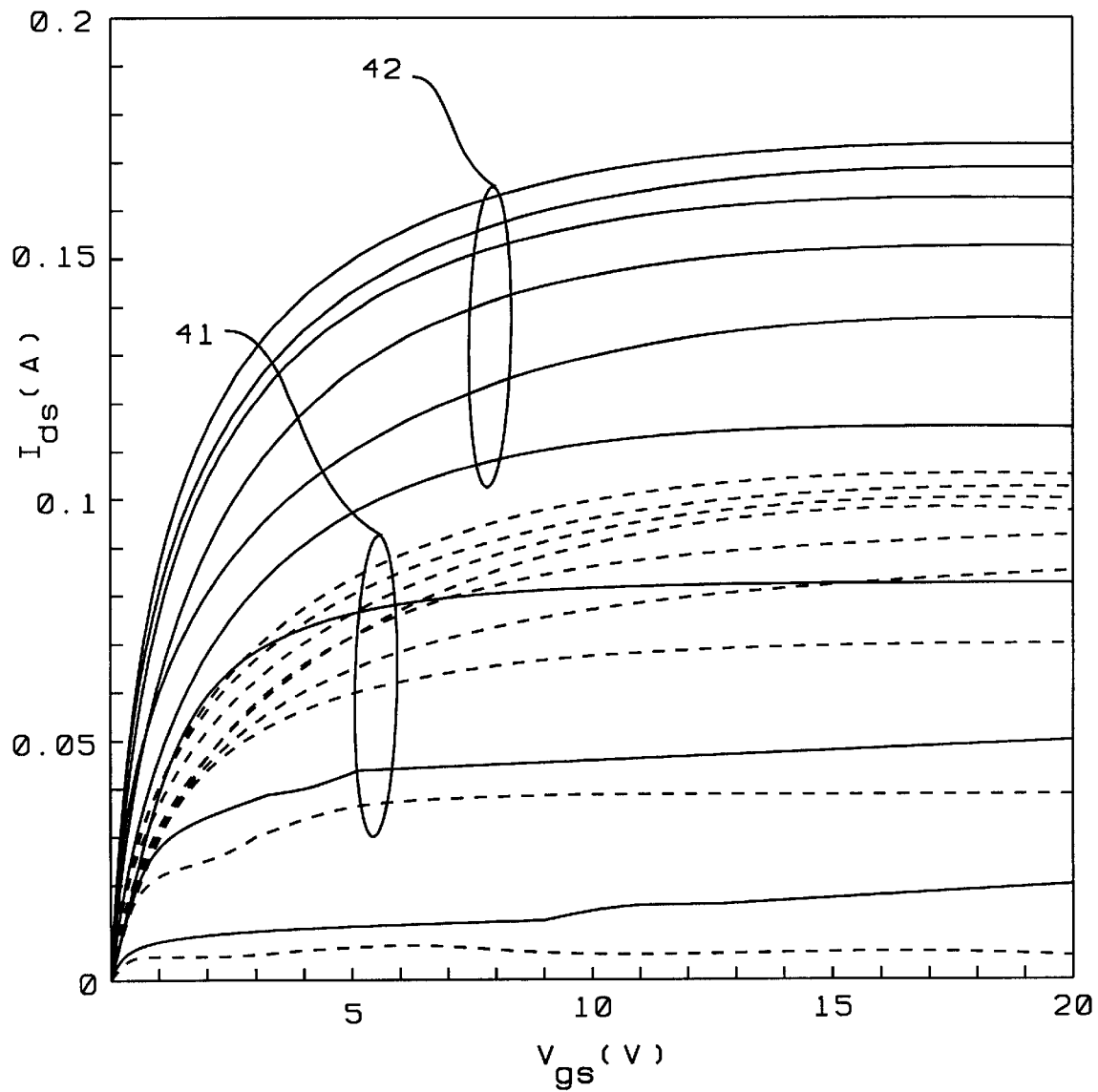
FIG. 4 shows plots of Ids vs. Vds for both prior art and the present invention.

Experimental confirmation:

FIG. 4 compares experimental I–V characteristics of the prior art with those of a stacked LDD RF LDMOSFET made according to the teachings of the present invention. It can be seen that at Vgs=20V, for the same current level of 70 mA, the on-state voltage drop was 5.1V for the conventional RF LDMOSFET (curve family 41) while it is reduced to only 3V (curve family 42) for the stacked LDD device, indicating an improvement of 70% for Von. At the same Vgs of 20V, the saturation current of the prior art and stacked LDD devices is 105 mA and 175 mA, respectively, with a 67% improvement in Idsat. The measured breakdown voltage of the prior art and stacked structures were approximately 64V and 74V, respectively. Thus, when compared to a device of the prior art, the stacked LDD structure provides a 16% improvement in the off-state performance.

Figure 5:
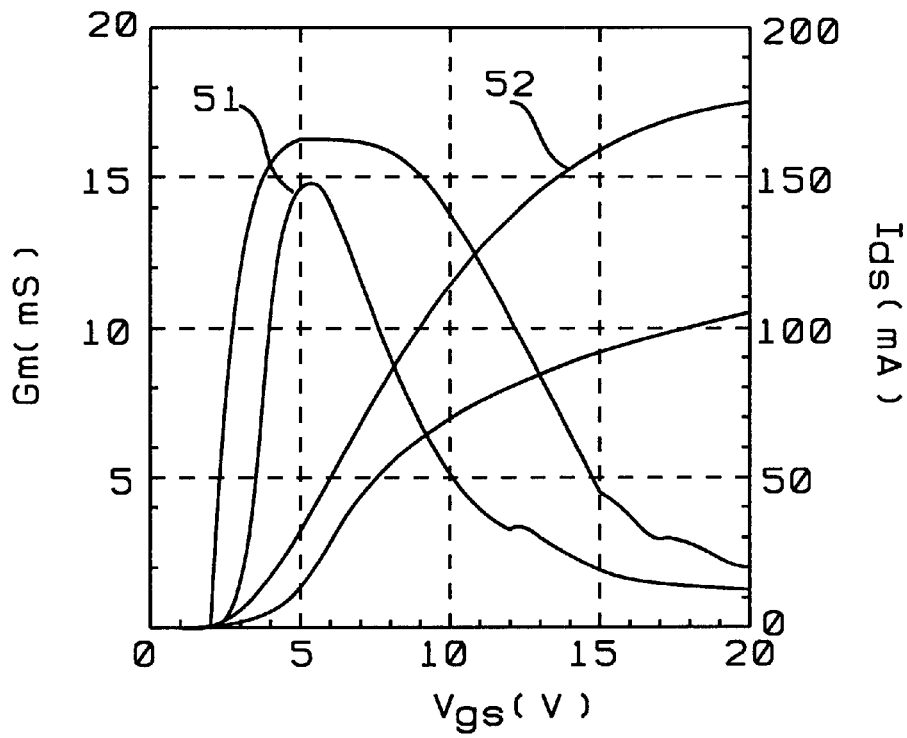
FIG. 5 shows plots of Gm(mS) and Ids as a function of Vgs for both the prior art and the present invention.

DC-measurements of fabricated transistors produced the transfer characteristics shown in FIG. 5. An outstanding attribute of the stacked LDD device is the wide plateau of high transconductance between Vgs=3V and Vgs=10V. The on-state resistance of a LDMOS mainly consists of channel resistance Rch and drift region resistance Rdrift. The total on-state resistance decreases with increasing gate bias. At a low gate bias, the value of the channel resistance is comparable to the drift resistance, and the drain current increases linearly with gate bias. At a high gate bias, due to the channel resistance being much lower than the drift resistance, the drain current is only affected by the drift resistance, and the gate easily loses its current control capability. The lower the drift region resistance, the stronger the gate control capability.

This performance is very important for RF LDMOS used in large signal power amplifiers. From FIG. 4, it can be seen that, at a high gate bias, the stacked LDD structure has a much higher gate control capability compared with that of the prior art RF LDMOS. This strong gate control capability is also shown in FIG. 5 in which a wide and flat transconductance vs. Vgs curve is obtained. At a gate voltage of 10V, the trans-conductance in the stacked LDD structure is 13.7 mS (arrow 52) while it is 5.6 mS in the prior art device (arrow 51). Thus, the transconductance of the stacked LDD is approximately 2.4 times higher than that of the prior art RF LDMOS. This means that the stacked LDD device has a lower inter-modulation distortion and higher power gain. Thus, the upper limit of the usable output power is much higher for the stacked LDD device.

In order to characterize the RF behaviors of the conventional and stacked LDD devices, on-wafer S-parameters were measured in the range from 0.5 GHz to 10.05 GHz using a HP 8510C network analyzer. The operating point of the device was varied between Vgs=3V and Vgs=15V at a fixed Vds of 20V. The gate bias dependence of $f_T$ at Vds=20V in both the prior art and stacked LDD devices were obtained.

Figure 6:
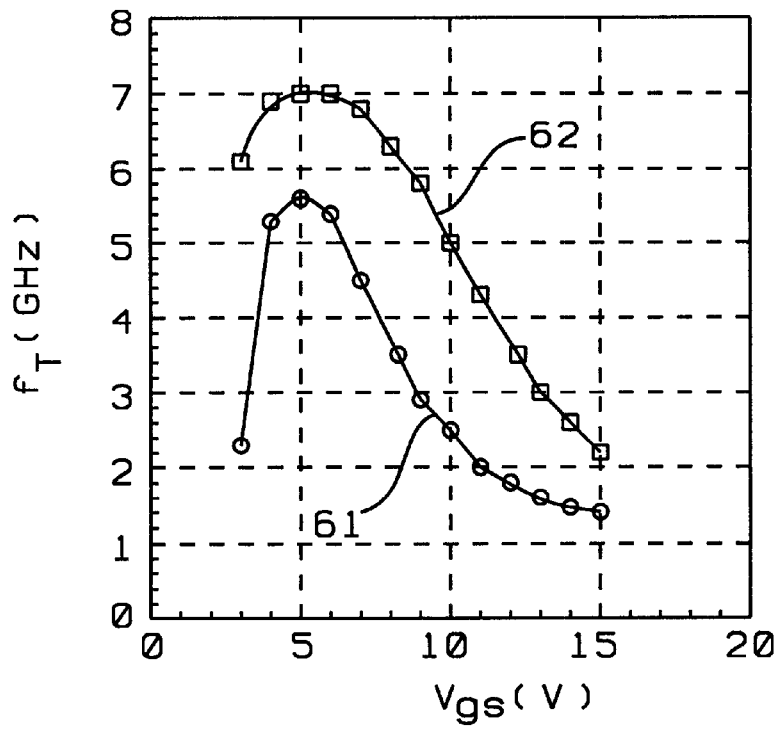
FIG. 6 plots fT-Vgs characteristics for both a prior art and a stacked LDD RF LDMOS device.

Referring now to FIG. 6, corresponding to the Gm behaviors in FIG. 5, the cut-off frequency of the stacked LDD device (curve 62) reaches its maximum of 7 GHz at Vgs=5V, keeps its high level up to Vgs=10V, and then decrease continuously. At a gate voltage of 10V, the stacked LDD structure still has a 5 GHz cut-off frequency—a 108% improvement over the prior art RF LDMOS which is shown as curve 61.

While the invention has been particularly shown and described with reference to the preferred embodiments thereof, it will be understood by those skilled in the art that various changes in form and details may be made without departing from the spirit and scope of the invention.

What is claimed is:

1. A process for manufacturing an LDMOSFET, comprising:

providing a P+ silicon substrate and depositing thereon an epitaxial layer of P– silicon having an upper surface;

forming a P+ sinker region that extends downwards from said upper surface through the P– epitaxial layer into the P+ substrate, by means of ion implantation through a mask, followed by a drive-in diffusion;

growing a layer of gate oxide on said upper surface and then depositing thereon a layer of phosphorus doped polysilicon;

patterning and etching said polysilicon layer to form a gate pedestal and then removing all gate oxide not under said gate pedestal;

by means of double diffusion through a mask, forming an N+ source region on a first side of said gate pedestal and a P– body under the gate and extending into said source region;

by ion implantation through a mask, forming a drain region on an opposing second side of the gate there being a separation region between the gate and the drain region;

in said separation region, forming, by ion implantation through an LDD mask, a first N type LDD layer that extends downward from said upper surface to a first interface;

in said separation region, forming, by ion implantation through said LDD mask, a P type LDD layer that extends downward from said first interface to a second interface; and in said separation region, forming, by ion implantation through said LDD mask, a second N type LDD layer that extends downward from said second interface to a third interface.

2. The process described in claim 1 wherein said first N type LDD layer has a resistivity between about 0.002 and 0.02 ohm cm.

3. The process described in claim 1 wherein said first N type LDD layer has a thickness between about 300 and 2,000 Angstroms.

4. The process described in claim 1 wherein said P type LDD layer has a resistivity between about 0.007 and 0.05 ohm cm.

5. The process described in claim 1 wherein said P type LDD layer has a thickness between about 1,000 and 3,000 Angstrom.

6. The process described in claim 1 wherein said second N type LDD layer has a resistivity between about 0.03 and 0.2 ohm cm.

7. The process described in claim 1 wherein said second N type LDD layer has a thickness between about 1,000 and 6,000 Angstroms.

8. The process described in claim 1 wherein said stacked LDMOSFET has breakdown voltage greater than about 70 volts and an on resistance less than about 0.05 ohms per micron where response is linear.

* * * * *